United States Patent
Hu et al.

(10) Patent No.: US 6,743,725 B1
(45) Date of Patent: Jun. 1, 2004

(54) HIGH SELECTIVITY SIC ETCH IN INTEGRATED CIRCUIT FABRICATION

(75) Inventors: Rongxiang Hu, Sane Jose, CA (US); Philippe Schoenborn, San Mateo, CA (US); Masaichi Eda, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 61 days.

(21) Appl. No.: 09/928,570

(22) Filed: Aug. 13, 2001

(51) Int. Cl.[7] ............... H01L 21/311; H01L 21/302; H01L 21/3065; C09K 13/00; C09K 13/06
(52) U.S. Cl. ............... 438/694; 438/706; 438/712; 252/79.4
(58) Field of Search ............... 438/694, 706, 438/712, 719, 700; 252/79.1, 79.4

(56) References Cited

U.S. PATENT DOCUMENTS

| | | | | |
|---|---|---|---|---|
| 5,904,487 A | * | 5/1999 | Conboy et al. | 438/14 |
| 6,103,590 A | * | 8/2000 | Swanson et al. | 438/409 |
| 6,251,770 B1 | * | 6/2001 | Uglow et al. | |
| 6,284,657 B1 | * | 9/2001 | Chooi et al. | 438/687 |
| 6,358,842 B1 | * | 3/2002 | Zhou et al. | 438/633 |
| 6,368,979 B1 | * | 4/2002 | Wang et al. | 438/723 |

* cited by examiner

*Primary Examiner*—Nadine G. Norton
*Assistant Examiner*—Lynette T. Umez-Eronini
(74) *Attorney, Agent, or Firm*—John R. Ley, LLC

(57) ABSTRACT

The subject matter described herein involves an improved etch process for use in fabricating integrated circuits on semiconductor wafers. The selectivity of the etch process for silicon carbide versus silicon oxide, organo silica-glass or other low dielectric constant type material is enhanced by adding hydrogen (H2) or ammonia (NH3) or other hydrogen-containing gas to the etch chemistry.

11 Claims, 1 Drawing Sheet

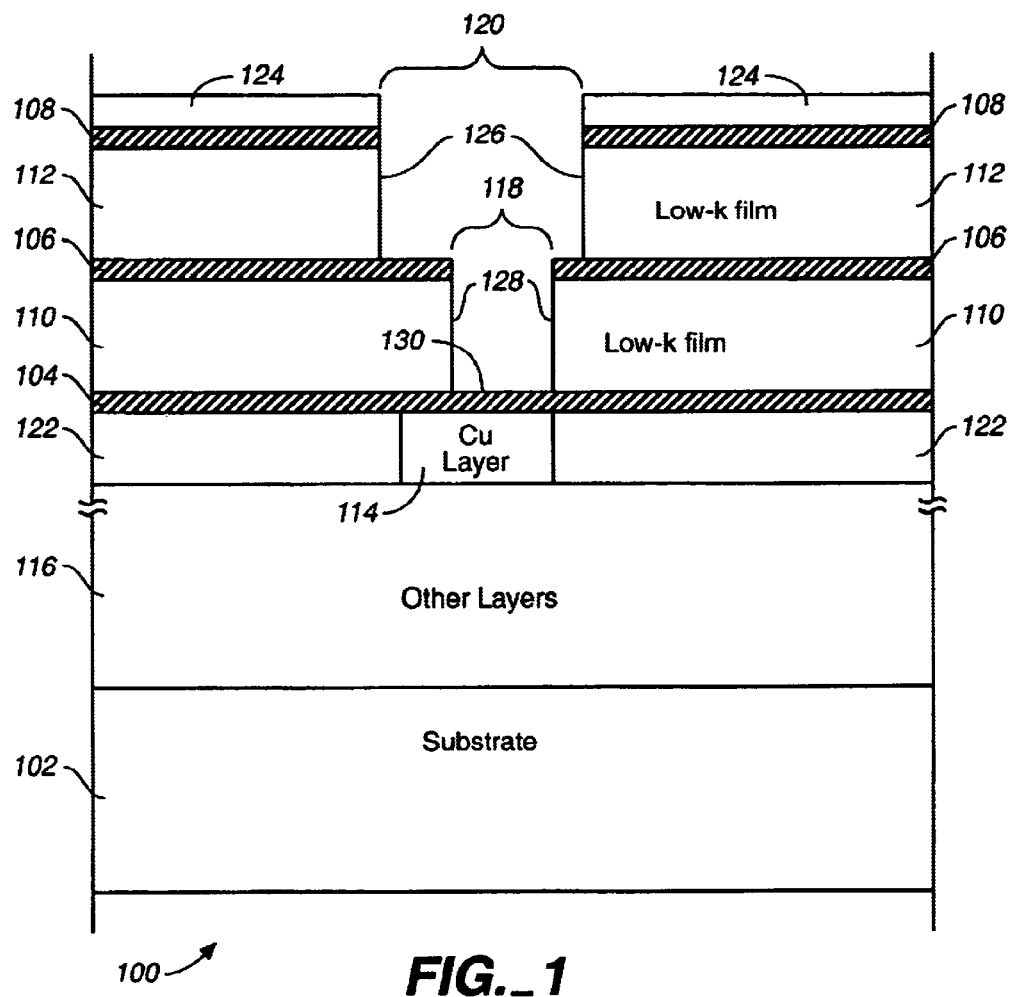
FIG._1

HIGH SELECTIVITY SIC ETCH IN INTEGRATED CIRCUIT FABRICATION

FIELD

The subject matter herein relates to fabrication of integrated circuits using a silicon carbide (SiC) etch stop layer.

BACKGROUND

In the fabrication of integrated circuits in and on a silicon wafer, particularly with copper (Cu) Damascene metallization processes, a silicon carbide (SiC) film, or layer, is commonly used as an etch stop, barrier or hard mask during plasma etching processes. The SiC film is relatively nonreactive to the plasma etch, which is typically used to remove silicon oxide, organo-silica-glass or other low k (dielectric constant) type materials that may be used in combination with the Cu Damascene metallization processes. Thus, the SiC film enables the plasma etch of the low k type material to stop at a desired depth or protects the underlying material from the plasma etch.

When it is necessary to remove the SiC film, an etch process is used that is relatively "selective" to the SiC. The SiC etch process typically uses CF4 (Carbon-Tetrafluorite), CHF3 (Trifluoromethane), CH2F2 (Difluoro-Methane ), CH4 (Methane) or the like as an etch chemistry. It is very difficult, however, to achieve a high selectivity to the SiC film that does not also affect the low k type material, thereby causing damage to, or erosion of, the low k type material.

It is with respect to these and other background considerations that the subject matter herein has evolved.

SUMMARY

The subject matter herein involves a new and improved etch chemistry for an improved SiC etch process that enhances, or increases, the selectivity of the etch process to the SiC film relative to the silicon oxide, OSG or other low k type material. In one particular embodiment, hydrogen (H2) or other hydrogen-containing gas is added to the prior art etch chemistry. Hydrogen has been found to facilitate the etching of the SiC film, while reducing the etch rate of the low k type material. In another particular embodiment, ammonia (NH3) is added to the prior art etch chemistry also to facilitate the etching of the SiC film and reduce the etch rate of the low k type material. In either embodiment, the selectivity of the etch chemistry to the SiC film is increased as compared to that for the low k type material. Thus, the SiC film can be more easily removed without damaging or eroding the low k type material.

A more complete appreciation of the present disclosure and its scope, and the manner in which it achieves the above noted improvements, can be obtained by reference to the following detailed description of presently preferred embodiments taken in connection with the accompanying drawings, which are briefly summarized below, and the appended claims.

BRIEF DESCRIPTION OF THE DRAWING

The single FIGURE is a cross section of exemplary structures formed on a substrate of a semiconductor wafer on which the subject matter herein may be practiced.

DETAILED DESCRIPTION

A semiconductor wafer 100, as shown in the FIGURE, typically includes a substrate 102 into and onto which various layers and structures of materials are formed and deposited by conventional means to form the desired integrated circuit chip. In particular, in the example shown, one or more silicon carbide (SiC) films, or layers, 104, 106 and 108 are deposited above the substrate 102. Also, in this example, one or more low k (dielectric constant) type material films 110 and 112 (e.g. silicon oxide, organo-silica-glass "OSG," etc.) are deposited between the SiC films 104, 106 and 108, as shown. Additionally, an underlying metal layer 114, such as copper (Cu), may be deposited under the first SiC film 104 and over various other layers 116 or structures formed in or deposited on the substrate 102. With this initial exemplary structure, a Damascene metallization process can be used to form an electrical connection through the low k type material films 110 and 112 and the SiC films 104, 106 and 108 to the underlying Cu layer 114.

In a Damascene metallization process, one or more insulating layers of material (such as the low k type material films 110 and 112 and the SiC films 104, 106 and 108) are deposited on top of the semiconductor wafer 100, and trenches (such as removed regions 118 and 120) are etched into the insulating layers. Thereafter, a metal material (such as copper, etc.) is deposited across the top of the semiconductor wafer 100 and into the trenches (removed regions 118 and 120). The metal material is then chemical mechanical polished (CMP) to remove the excess metal material that covers the area beyond the trenches and form a relatively smooth top surface for the semiconductor wafer 100.

For the exemplary structure shown, the deposition and removal processes are conventional, except for the improved SiC etch process described below. Also, a variety of other combinations of steps or procedures may be used to form the same or similar structures shown in this example.

After the various other layers 116 and structures, in the example, have been formed in or above the substrate 102, an insulating layer 122 (such as silicon oxide, etc.) is typically deposited on top of the other layers 116. A region of the insulating layer 122 is etched away, so that the underlying Cu layer 114 can be formed therein. Alternatively, the underlying Cu layer 114 may be deposited on top of the various other layers 116 and portions of the underlying Cu layer 114 may be removed, so that the insulating layer 122 may be formed therein.

For the exemplary structure shown, the first SiC film 104 is deposited on top of the underlying Cu layer 114 and the insulating layer 122. The first SiC film 104 primarily serves as an etch stop for a subsequent etching of the first low k type material film 110. The first low k type material film 110 is then deposited on top of the first SiC film 104. The second SiC film 106 is deposited on top of the first low k type material film 110 to serve as an etch stop or barrier for a subsequent etching of the second low k type material film 112. At this point, an etch mask layer (not shown) is deposited on the second SiC film 106 and patterned for the region 118, so the portion of the second SiC film 106 within the region 118 can be etched away to expose a portion of the first low k type material film 110. The SiC etch process may be the improved SiC etch process described herein, or since there is not yet an overlying low k type material that may be affected (e.g. damaged or eroded) by the SiC etch process, the SiC etch process may be conventional. The etch mask layer is removed, and the second low k type material film 112 is deposited on top of the second SiC film 106 and into the region 118 where the second SiC film 106 has been removed. The third SiC film 108 (used as a hard mask for subsequent processes) is optional and is deposited on top of the second low k type material film 112. An etch mask layer 124 is deposited onto the third SiC film 108 and patterned for the region 120 to expose a portion of the third SiC film 108. The portion of the third SiC film 108 within the region 120 is etched away to expose a portion of the second low k type material film 112. Again, the SiC etch process may be the improved SiC etch process described herein, or since there is not yet an overlying low k type material that may be affected (e.g. damaged or eroded) by the SiC etch process, the SiC etch process may be conventional. Then the second low k type material film 112 is etched away in the region 120 exposing sidewalls 126 of the second low k type material film 112. Upon reaching the second SiC film 106, the etching of the second low k type material film 112 stops, except for the low k type material that was deposited in the region 118 where the second SiC film 106 was previously removed. If the first low k type material film 110 can be etched by the same process that removes the second low k type material film 112, then the etch process may continue into the first low k type material film 110 in the region 118. Otherwise, another etch process is used to etch away the portion of the first low k type material film 110 in the region 118 exposing sidewalls 128 of the first low k type material film 110. The exposed portion of the second SiC film 106 at the bottom of the region 120, thus, also serves as an etch barrier protecting the underlying portions of the first low k type material film 110 as the first low k type material film 110 is etched away in the region 118. Upon reaching the first SiC film 104, the etching of the first low k type material film 110 stops having exposed a portion 130 of the first SiC film 104.

At this point, the portion of the first SiC film 104 below the region 118 is to be removed to expose the underlying Cu layer 114, so that an electrical connection can be made thereto. In order not to erode or otherwise damage the exposed sidewalls 126 and 128 of the second and first low k type material films 112 and 110, respectively, the improved SiC etch process described herein is used to etch away the exposed portion 130 of the first SiC film 104. The improved SiC etch process will also likely remove the exposed portions of the second SiC film 106.

After the exposed portion 130 of the first SiC film 104 is removed, a metal region, or other conductive region, (not shown) is generally formed in the regions 118 and 120 by an appropriate process, such as a Damascene metallization process. An appropriate conductive material (such as Cu, aluminum, etc.) is thus deposited into the regions 118 and 120. Any excess of the conductive material outside of the region 120 is removed by a conventional chemical mechanical polishing process.

The improved SiC etch process adds hydrogen (H2) or ammonia (NH3) or other hydrogen-containing gas to the conventional SiC etch chemistry of CF4 (carbon-tetrafluorite), CHF3 (trifluoromethane), CH2F2 (difluoro-methane), CH4 (methane) or the like. The H2 or NH3 is added to the conventional SiC etch chemistry either in the etch chamber (not shown) in which the etching takes place or in the gas flow upstream of the etch chamber. The addition of H2 or NH3 to the etch chemistry improves, or increases, the selectivity of the etch chemistry to the SiC relative to the low k type material films 110 and 112 while maintaining control of the profile of the exposed portions of the SiC films 104-106. In other words, the rate at which the exposed portions of the SiC films 104 and 106 are etched away is increased relative to the rate at which the exposed portions of the low k type material films 110 and 112 are eroded by the SiC etch process.

In an exemplary embodiment of the improved SiC etch process, a range for the preferred ratio for the carbon, fluoride and hydrogen (C:F:H) is 1:1:2 to 1:8:4 at a gas flow rate of about 50 to 100 sccm, a temperature of about −30° C. to 80° C., a pressure of about 5 mT to 300 mT and a power of about 200 to 1500 Watts. These parameters may result in an etch rate on the SiC films 104 and 106 of about 1000 to 3000 angstroms per minute.

The addition of hydrogen to the etch chemistry (by either H2 or NH3) enables greater control and variability of the C:F:H ratio than does the prior art, which uses only a single gas. Thus, the anticipated chemical reaction that etches away the proper material can be manipulated as desired to control the selectivity of the etch chemistry to the SiC relative to the low k type material.

Presently preferred embodiments of the subject matter herein and its improvements have been described with a degree of particularity. This description has been made by way of preferred example. It should be understood that the scope of the claimed subject matter is defined by the following claims, and should not be unnecessarily limited by the detailed description of the preferred embodiments set forth above.

What is claimed is:

1. A method of removing an exposed silicon carbide layer from an underlying copper layer during fabrication of an integrated circuit chip on a semiconductor wafer which also has an exposed low dielectric constant material layer adjacent to the silicon carbide layer, the method comprising:

flowing an etch chemical into contact with the silicon carbide layer and the low dielectric constant material layer, the etch chemical selected from the group consisting of carbon-tetrafluorite(CF4), trifluoromethane (CHF3), difluoro-methane (CH2F2) and methane (CH4);

introducing a selectivity enhancing chemical into the flow of the etch chemical to create a combination flow of the etch chemical and the selectively enhancing chemical, the selectivity enhancing chemical selected from the group consisting of hydrogen (H2) and ammonia (NH3), the selectivity enhancing chemical increasing the selectivity of the etch chemical to the silicon carbide layer relative to the low dielectric constant material; and etching the exposed silicon carbide layer from the underlying copper layer with the combination flow without substantially removing the exposed low dielectric constant material.

2. A method as defined in claim 1 further comprising:
introducing the selectivity enhancing chemical to produce a C:H:F ratio of about 1:1:2 to about 1:8:4 in the resulting combination flow.

3. A method as defined in claim 1 further comprising:
introducing the selectivity enhancing chemical into the flow of the etch chemical prior to flowing the etch chemical into contact with the surface of the semiconductor wafer.

4. A method as defined in claim 1 further comprising:
introducing the selectivity enhancing chemical into the flow of the etch chemical substantially simultaneously with the flowing of the etch chemical into contact with the surface of the semiconductor wafer.

5. A method as defined in claim 1 further comprising:
flowing the etch chemical into contact with the surface of the semiconductor wafer at a temperature in a range of about −30° C. to about 80° C., a pressure in a range of about 5 mT to about 300 mT and a power level in a range of about 200 Watts to about 1500 Watts.

6. A method for performing a damascene metallization process during fabrication of an integrated circuit chip on a semiconductor wafer comprising:

forming a copper layer on the semiconductor wafer;

forming a silicon carbide layer on the copper layer;

forming a layer of a low dielectric constant material on the semiconductor wafer;

removing a region of the low dielectric constant material to expose a portion of the silicon carbide layer and a portion of the low dielectric constant material;

flowing an etch chemical into contact with the exposed portions of the silicon carbide layer and the low dielectric material, the etch chemical selected from the group consisting of carbon-tetafluoride(CF4), trifluoromethane (CHF3), difluoro-methane (CH2F2) and methane (CH4);

introducing a selectivity enhancing chemical into the flow of the etch chemical to create a combination flow of the etch chemical and the selectivity enhancing chemical, the selectivity enhancing chemical selected from the group consisting of hydrogen (H2) and ammonia (NH3), the selectivity enhancing chemical increasing the selectivity of the etch chemical to the silicon carbide layer relative to the low dielectric constant material;

removing a region of the exposed silicon carbide layer with the combination flow to expose a portion of the copper layer without substantially eroding the exposed portion of the low dielectric constant material; and forming a metal region into the removed regions of the low dielectric constant material and the silicon carbide layer.

7. A method as defined in claim 6 further comprising;

forming the metal region by depositing copper (Cu) into the removed regions of the low dielectric constant material and the silicon carbide layer.

8. A method as defined in claim 6 further comprising:

introducing the selectivity enhancing chemical to produce a C:H:F ratio of about 1:1:2 to about 1:8:4 in the resulting combination flow.

9. A method as defined in claim 6 further comprising:

introducing the selectivity enhancing chemical into the flow of the etch chemical prior to flowing the etch chemical into contact with the portions of the silicon carbide layer and the low dielectric constant material.

10. A method as defined in claim 6 further comprising:

introducing the selectivity enhancing chemical into the flow of the etch chemical substantially simultaneously with the flowing of the etch chemical into contact with the exposed portions of the silicon carbide layer and the low dielectric constant material.

11. A method a defined in claim 6 further comprising:

flowing the etch chemical into contact with the exposed portions of the silicon carbide layer and the low dielectric material at a temperature in a range of about −30° C. to about 80° C., a pressure in a range of about 5 mT to about 300 mT and a power level in a range of about 200 Watts to about 1500 Watts.

* * * * *